(12) United States Patent
Kwon

(10) Patent No.: US 7,687,226 B2
(45) Date of Patent: Mar. 30, 2010

(54) METHOD FOR FABRICATING PRINTING PLATE WITH FINE PATTERN USING ELECTRIC FIELD

(75) Inventor: Oh Nam Kwon, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 195 days.

(21) Appl. No.: 11/415,280

(22) Filed: May 2, 2006

(65) Prior Publication Data

US 2007/0154842 A1    Jul. 5, 2007

(30) Foreign Application Priority Data

Dec. 29, 2005   (KR) ..................... 10-2005-0133600

(51) Int. Cl.
*C10G 32/02*   (2006.01)
*C25D 17/00*   (2006.01)
*G03F 7/26*    (2006.01)

(52) U.S. Cl. ................... 430/302; 204/212; 204/667

(58) Field of Classification Search ............. 430/270.1, 430/302; 204/212, 371, 667, 727; 313/49
See application file for complete search history.

(56) References Cited

U.S. PATENT DOCUMENTS

| 3,293,156 | A  | * | 12/1966 | Allison ..................... 205/127 |
| 5,558,977 | A  | * | 9/1996  | DePalma et al. ............ 430/496 |
| 6,207,331 | B1 | * | 3/2001  | Akutsu et al. ................. 430/33 |
| 2004/0175648 | A1 | * | 9/2004 | Goto ....................... 430/270.1 |
| 2006/0255009 | A1 | * | 11/2006 | Card et al. ................... 216/13 |

\* cited by examiner

*Primary Examiner*—Cynthia H Kelly
*Assistant Examiner*—Chanceity N Robinson
(74) *Attorney, Agent, or Firm*—Holland & Knight LLP

(57) ABSTRACT

A fabricating method of a printing plate includes forming a first conductive layer on an upper surface of a printing plate, forming a second conductive layer on a lower surface of the printing plate, forming an etch-resist pattern by etching a portion of the first conductive layer, submerging the printing plate, the second conductive layer and the etch-resist pattern into an electrolytic solution, and applying an electrical field between the etch-resist pattern and the second conductive layer so that the electrolytic solution is dissociated to form an anisotropically etched fine pattern in the printing plate.

6 Claims, 18 Drawing Sheets

METHOD FOR FABRICATING PRINTING PLATE WITH FINE PATTERN USING ELECTRIC FIELD

This application claims the benefit of the Korean Patent Application No. P2005-0133600 filed on Dec. 29, 2005, which is hereby incorporated by reference in its entirety.

BACKGROUND OF THE INVENTION

1. Field of the Invention

The present invention relates to a fabricating method of a plate, and more particularly to a fabricating method of a printing plate with a fine pattern using an electric field.

2. Description of the Related Art

In general, a liquid crystal display device controls the light transmittance of liquid crystal molecules by controlling their orientation through the use of an electric field, thereby displaying a picture. To this end, the liquid crystal display device includes a liquid crystal display panel where liquid crystal cells are arranged in a matrix shape, and a drive circuit for driving the liquid crystal display panel. FIG. 1 is an exploded perspective plan view representing a liquid crystal display panel of the related art. The liquid crystal display panel, as shown in FIG. 1, includes a thin film transistor substrate 70 and a color filter substrate 80 which are bonded together to face each other with liquid crystal molecules 90 therebetween.

The thin film transistor substrate 70 includes: a gate line 71 and a data line 72 crossing each other; a thin film transistor 73 formed at the crossing of the gate and data lines 71 and 72; a pixel electrode connected to the thin film transistor 73; and a lower alignment film (not shown) over the pixel electrode 74 for aligning the liquid crystal molecules 90.

The thin film transistor 73 includes: a semiconductor layer (not shown) forming channel; a source electrode (not shown) connected to the data line 72; and a drain electrode (not shown) facing the source electrode with the channel therebetween. Herein, the semiconductor layer includes an active layer (not shown) which forms a channel between the source electrode and the drain electrode; and an ohmic contact layer (not shown) which is located on the active layer to provide an ohmic contact between the source electrode and the active layer at one end of the active layer and between the drain electrode and the active layer at another end of the active layer.

The color filter substrate 80 includes: a black matrix 81 for preventing light leakage; a color filter 82 for realizing color; a common electrode 83 forming a vertical electric field with the pixel electrode 74; and an upper alignment film 84 over the common electrode 83 for aligning the liquid crystal molecules 90. The alignment film 84 acts to align liquid crystal molecules 90, disposed between the thin film transistor substrate 70 and the color filter substrate 80, in an initial designated direction. Alignment grooves (not shown) along which the liquid crystal molecules line up are formed in the alignment film 84 by a rubbing process wherein an organic film, such as polyimide, is used as an alignment film.

The gate line, the data line, the active layer can be formed on the thin film transistor substrate by a plurality of patterning processes that include the use of masks. Further, the black matrix and color filters can be formed on the color filter substrate with a plurality of patterning processes that include the use of masks. Such patterning processes include many processes, such as thin film deposition, cleaning, photolithography, etching, and photo-resist removal, etc. Thus, a patterning process using a mask has the problem of having a high manufacturing cost due to its complexity. To solve this problem, an off-set printing method of transferring a pattern onto the thin film transistor substrate or the color filter substrate has been developed in which the pattern is printed by a printing plate. The pattern is formed on the printing plate by spreading photo-resist over the printing plate with a roller and then partially curing the photo-resist.

FIGS. 2A to 2H illustrate production process stages of a printing plate in which an isotropically-etched fine pattern of the related art is formed. Hereinafter, referring to FIGS. 2A to 2H, a method of forming a fine pattern on a substrate by an off-set printing method of the related art will be described in detail. First, as shown in FIGS. 2A, a conductive metal layer 12 is formed on a printing plate 11 by a deposition technique, such as sputtering, etc. The conductive layer 12 formed on the printing plate 11 is formed of a conductive metal or combination of conductive metals, such as chrome Cr, molybdenum Mo, copper Cu, and ITO.

Then, as shown in FIG. 2B, exposure and development processes are performed by spreading a photo-resist 20 on the conductive metal layer 12 and using a mask to cure the photo-resist 20 with ultraviolet light so as to form a fine photo-resist pattern on the conductive metal layer 12.

After the exposure and development processes for the photo-resist 20 are performed as described above, a photo-resist pattern 20A exposing a conductive metal layer 12 on the printing plate 11 is formed by removing the exposed portion of the photo-resist 20, as shown in FIG. 2C.

An etching process is performed on the conductive metal layer 12 exposed by the photo-resist pattern 20A, as shown in FIG. 2D.

After the etching process, the entire photo-resist pattern 20A formed on the etched conductive metal layer 12 is removed. Thus, a metal pattern 12A used as an etching-resist when forming a fine pattern on the printing plate 11 is formed, as shown in FIG. 2E.

After forming the metal pattern 12A on the printing plate 11, an etching process is performed on the exposed area of the printing plate 11 using the metal pattern 12A formed on the printing plate 11 as the etching-resist, as shown in FIG. 2F.

As the etching process is performed on the area of the printing plate 11 exposed through the metal pattern 12A acting as the etching-resist, the area of the printing plate 11 is simultaneously etched in both vertical and horizontal directions within the printing plate 11, as shown in FIG. 2G After the etching of the printing plate 11, the metal pattern 12A acting as the etching resist on the printing plate 11 is removed by another etching process. The pattern 11A etched into the printing plate has a depth D in a vertical direction that is equal to the pattern width W in the horizontal direction, as shown in FIG. 2H.

In the case of forming a pattern in the printing plate 11 by the related art method described above, the printing plate 11 is isotropically etched in both the horizontal and vertical directions as the etching process is performed through the metal pattern 12A acting as the etching-resist, as shown in FIG. 2G Accordingly, there is difficulty in forming a fine pattern 11 A having a pattern width less than the depth of the pattern.

SUMMARY OF THE INVENTION

Accordingly, the present invention is directed to a fabricating method of a printing plate with an anisotropically etched fine pattern using an electric field that substantially obviates one or more of the problems due to limitations and disadvantages of the related art.

Accordingly, it is an object of the present invention to provide a fabricating method of a printing plate to accurately form a fine pattern.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other objects of the invention, a fabricating method of a printing plate includes forming a first conductive layer on an upper surface of a printing plate, forming a second conductive layer on a lower surface of the printing plate, forming an etch-resist pattern by etching a portion of the first conductive layer, submerging the printing plate, the second conductive layer and the etch-resist pattern into an electrolytic solution, and applying an electrical field between the etch-resist pattern and the second conductive layer so that the electrolytic solution is dissociated to form a pattern in the printing plate.

In another aspect, a fabricating method of a printing plate includes forming a first metal layer on an upper surface of a printing plate, forming a second metal layer on a lower surface of the printing plate, forming a metal pattern by etching a portion of the first metal layer to expose an area of the printing plate, submerging the printing plate, the second metal layer and the metal pattern into an electrolytic solution, and etching the exposed area of the printing plate with an electrical field between the metal pattern and the second metal layer to form a pattern in the printing plate.

In yet another aspect, a fabricating method of a printing plate includes forming a first conductive layer on an upper surface of a printing plate, forming a second conductive layer on a lower surface of the printing plate, forming an etch-resist pattern by etching a portion of the first conductive layer to expose an area of the printing plate, submerging the printing plate, the second conductive layer and the etch-resist pattern into an electrolytic solution, and applying an electrical field between the etch-resist pattern and the second conductive layer to form a pattern in the printing plate in which a depth of the pattern is greater than a width of the pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
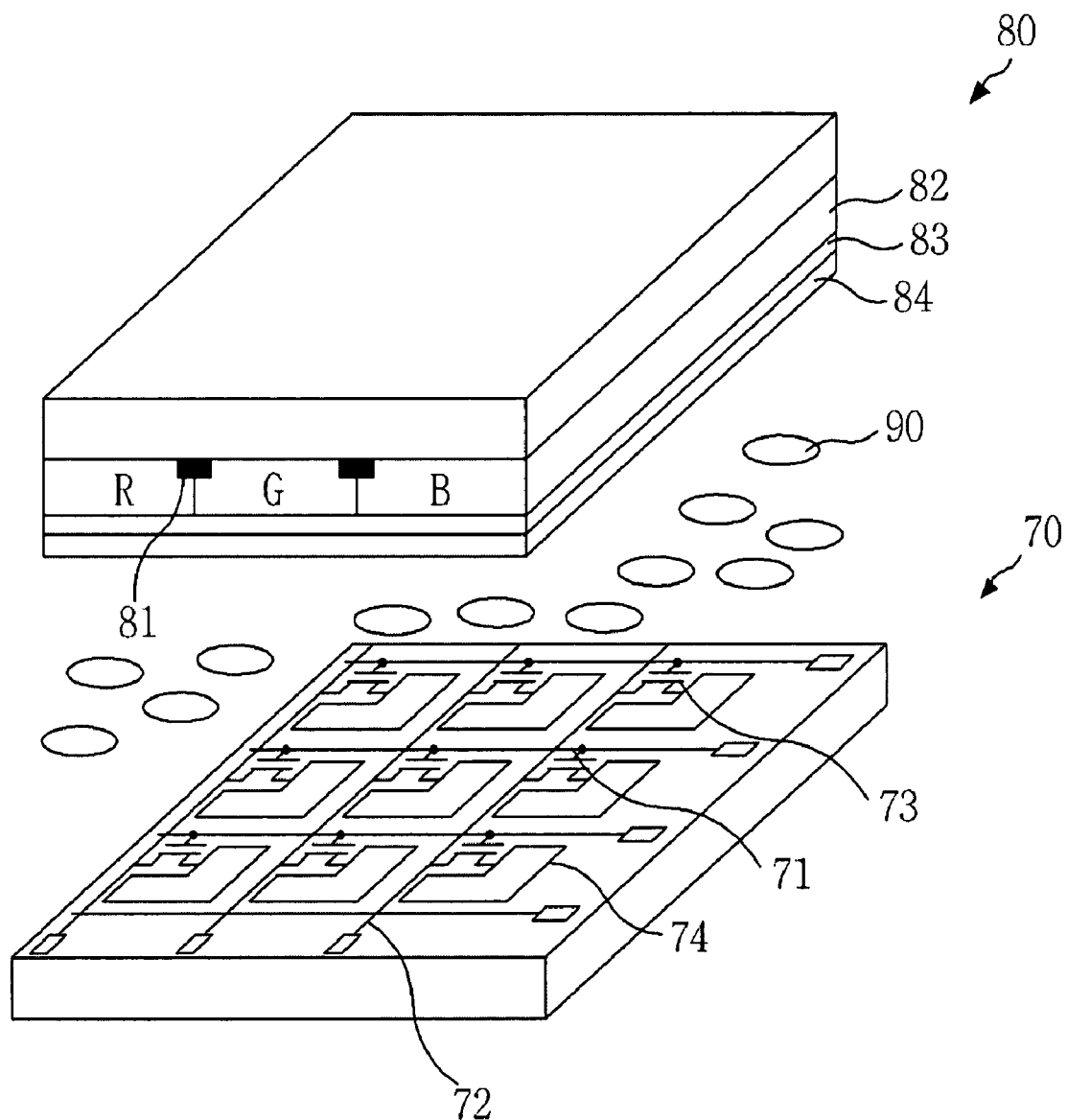
FIG. 1 is an exploded perspective plan view representing a liquid crystal display panel of the related art.
Figure 2A:
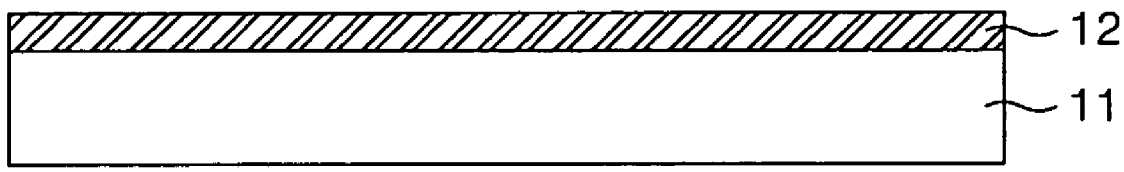
FIGS. 2A to 2H illustrate a production process stages of a printing plate where an isotropically-etched fine pattern of the related art is formed.
Figure 2B:
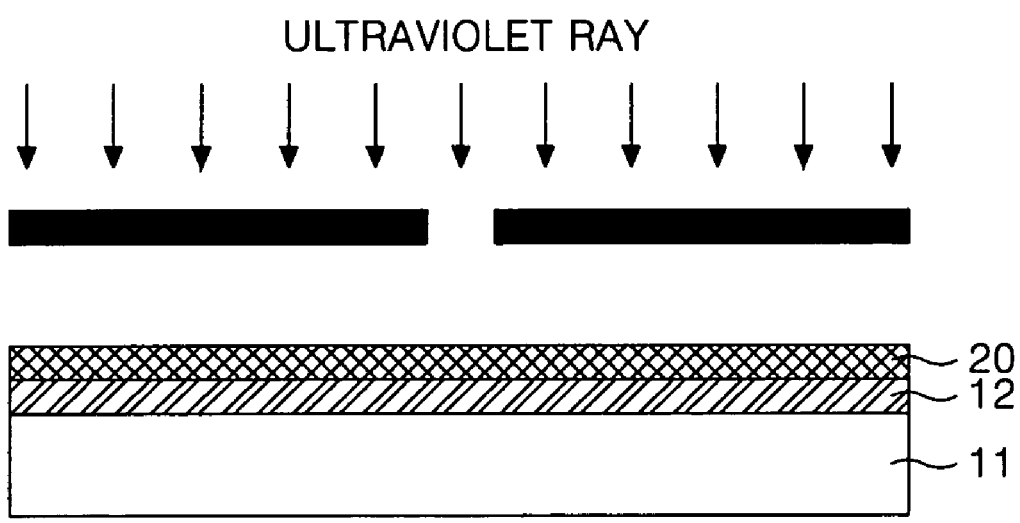
Figure 2C:
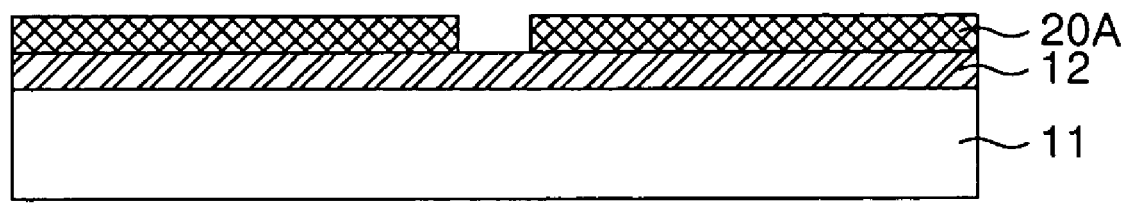
Figure 2D:
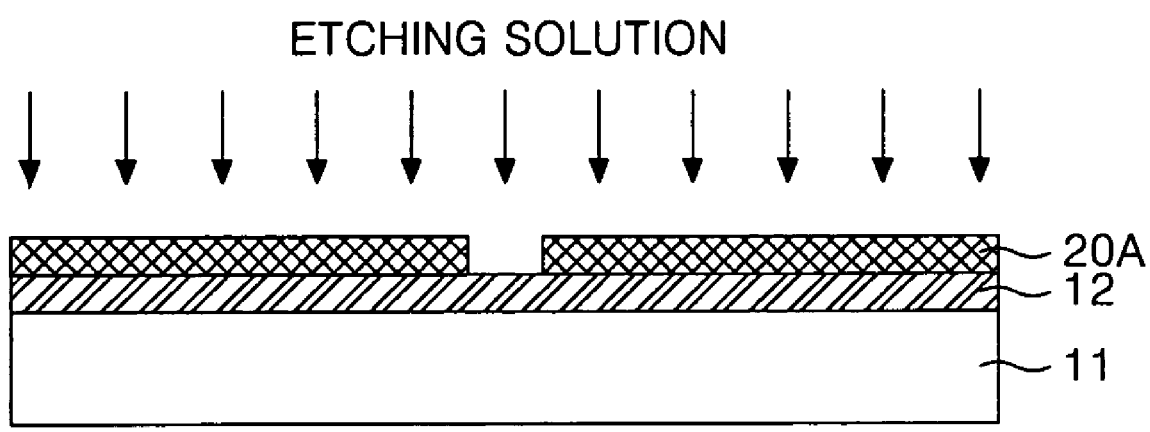
Figure 2E:
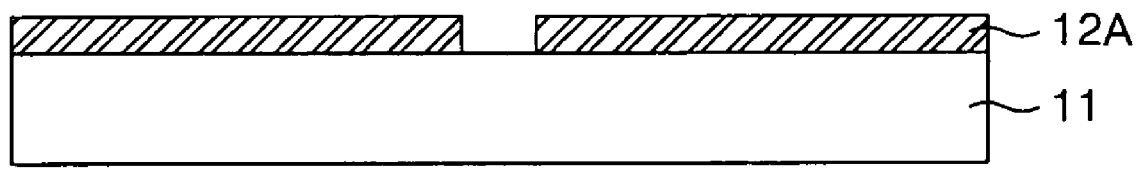
Figure 2F:
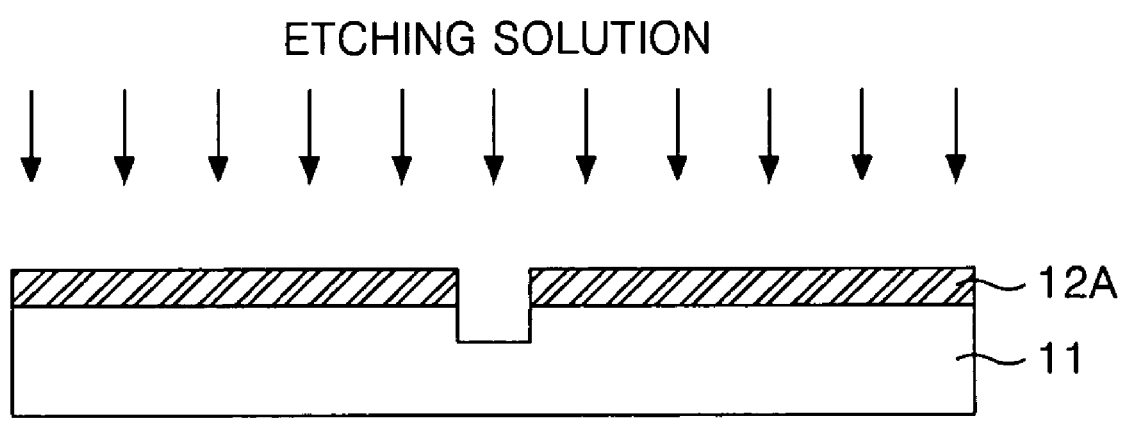
Figure 2G:
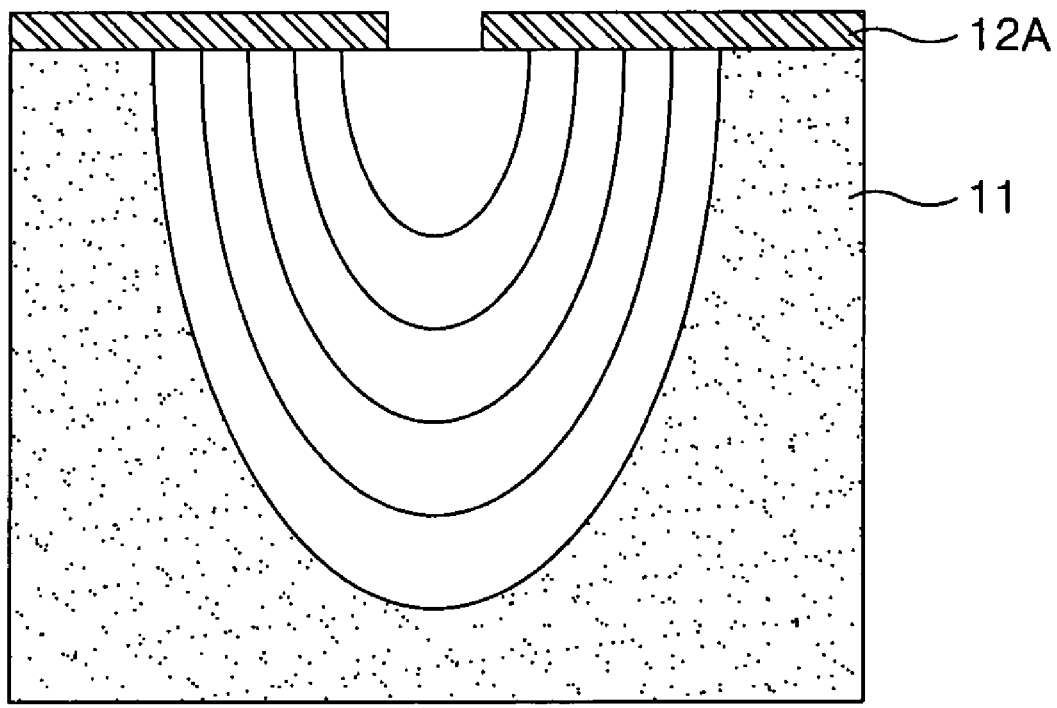
Figure 2H:
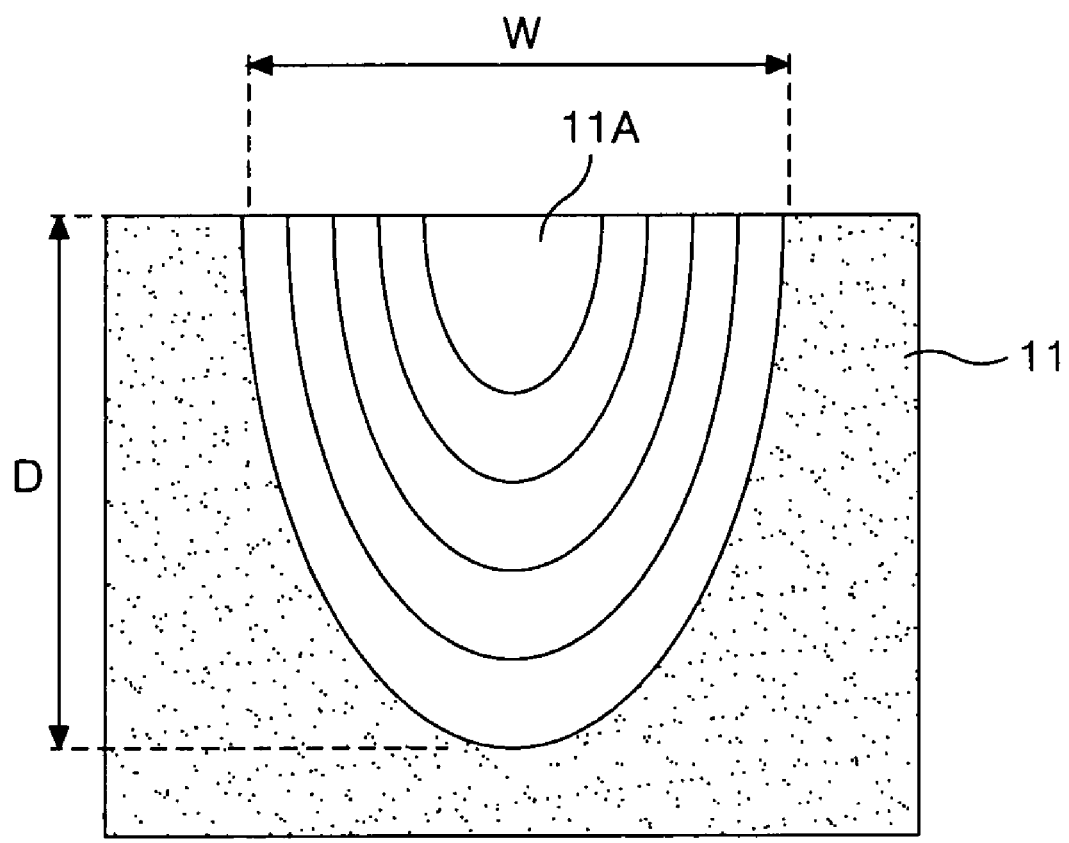
Figure 3:
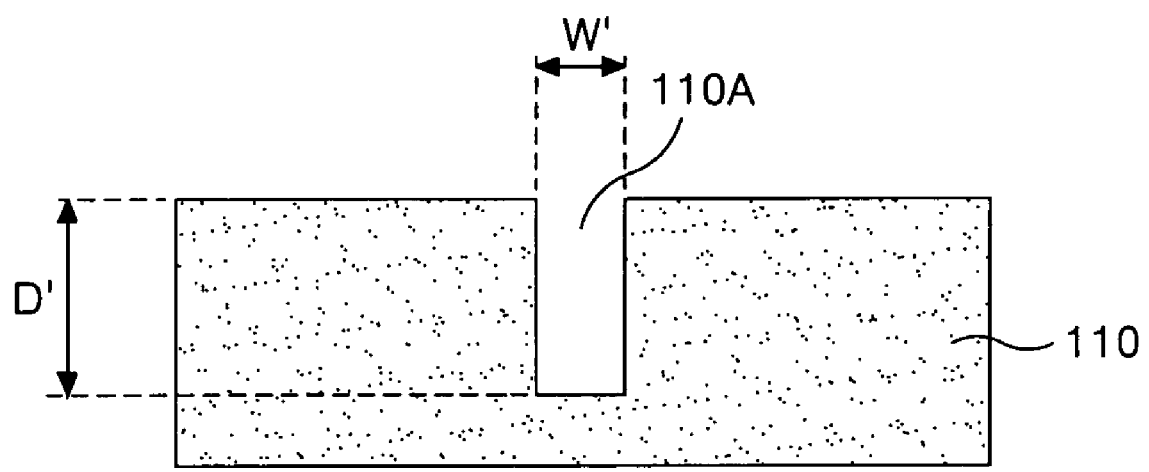
FIG. 3 is a cross-sectional view of a printing plate in which an anisotropically etched fine pattern is formed by use of an electric field according to an embodiment of the present invention.

FIG. 3 is a cross-sectional view of a printing plate in which an anisotropically etched fine pattern is formed by use of an electric field according to an embodiment of the present invention Referring to FIG. 3, a fine pattern 110A in a printing plate 110 is etched more in a vertical direction than in a horizontal direction. Accordingly, the pattern width W' of the fine pattern 110A is less than the depth D' of the fine pattern 10A. FIGS. 4A to 4H show a production process stages of forming the printing plate with an the anisotropically etched pattern by use of electric field according to an embodiment of the present invention. Hereinafter, in reference to FIGS. 4A to 4H, a fabricating process of a printing plate in which a fine pattern is etched anisotropically by use of an electric field will be explained.

Figure 4A:
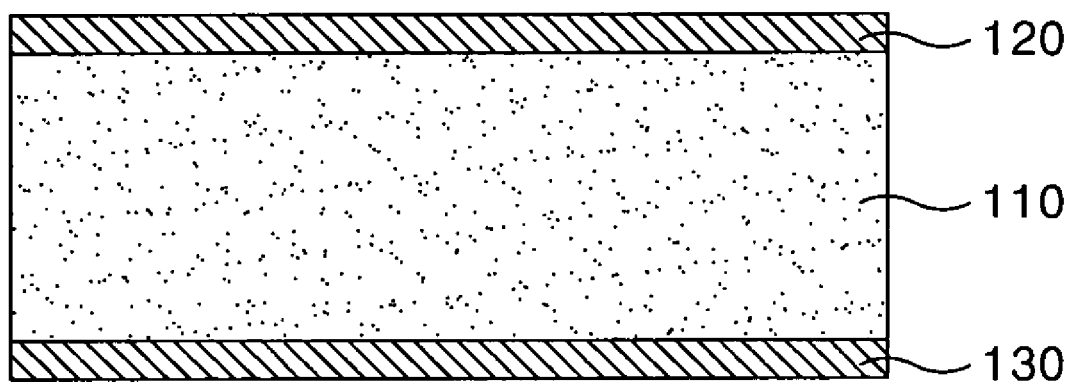
FIGS. 4A to 4H show a production process stages of forming the printing plate with an the anisotropically etched pattern by use of electric field according to an embodiment of the present invention.
Figure 4B:
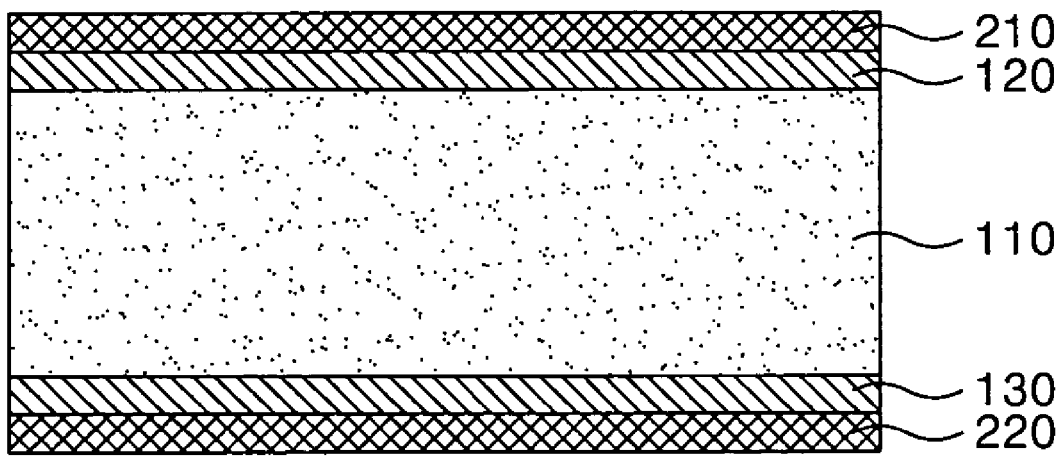

First, as shown in FIG. 4A, conductive layers 120 and 130 are deposited on the upper and lower surfaces of the printing plate 110 by a deposition method, such as sputtering or plasma enhanced chemical vapor deposition (PECVD). The printing plate 110 can be glass. The conductive layers 120 and 130 deposited on the upper and lower surfaces of the printing plate 110 are formed of a metal or combination of metals that do not electrolyzed in a hydrofluoric acid solution, such as chrome Cr, molybdenum Mo, copper Cu or ITO.

Figure 4C:
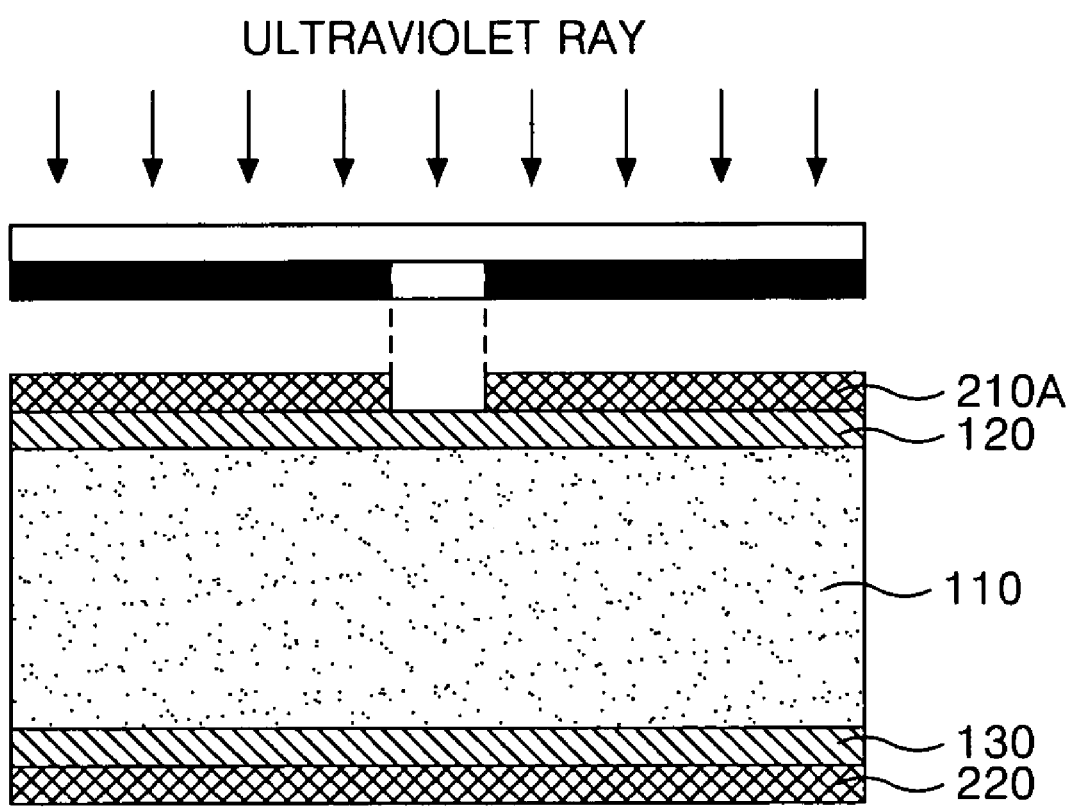

After forming the conductive layers 120 and 130, which do not electrolyzed in a hydrofluoric acid solution, on the upper and lower surfaces of the printing plate 110, photo-resists 210 and 220 are respectively spread all over the conductive layers 120 and 130. After the photo-resists 210 and 220 are spread over the conductive layers 120 and 130 on the upper and lower surfaces of the printing plate 110, exposure and development processes are performed on the photo-resist 210 by use of a mask, thereby forming a photo-resist pattern 210A for exposing an area of the conductive layer 120, which is formed on the upper surface of the printing plate 110, as shown in FIG. 4C.

Figure 4D:
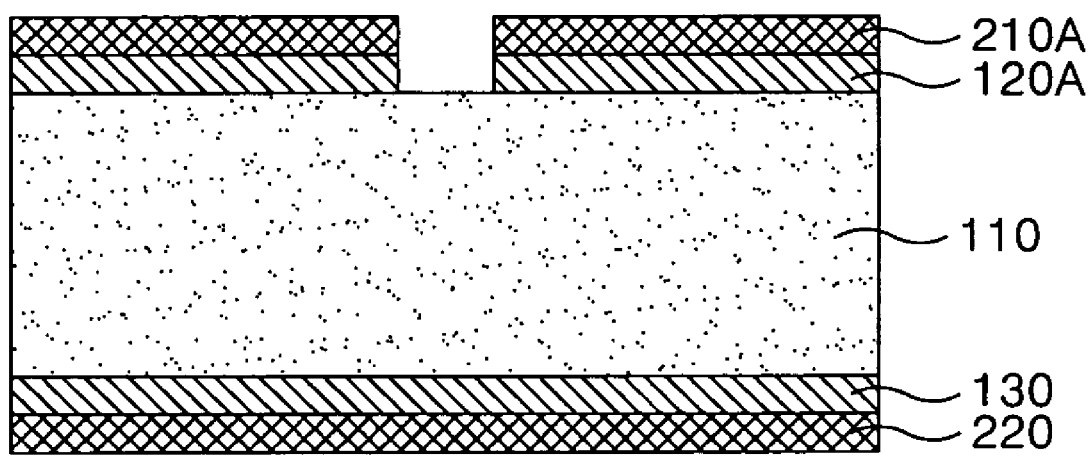

After forming the photo-resist pattern 210A on the conductive layer 120, as shown in FIG. 4D, an etching process is performed on the area of the conductive layer 120 exposed by the photo-resist pattern 210A, thereby forming the metal pattern 120A, which acts as an etch-resist for the printing plate 110. The metal pattern 120A formed on the upper surface of the printing plate 110 not only acts as an etch-resist, but also can act as an electrode receiving power from an outside source together with the conductive layer 130 formed on the lower surface of the printing plate 110 acting as another electrode. Further, the photo-resist pattern 210A residing on the metal pattern 120A formed on the upper surface of the printing plate 110 and the photo-resist 220 residing on the conductive layer 130 formed on the lower surface of the printing plate 110 can act to concentrate the electric field in a vertical direction through the printing plate 110 between the metal pattern 120A and the conductive layer 130 formed on the lower surface of the printing plate 110.

Figure 4E:
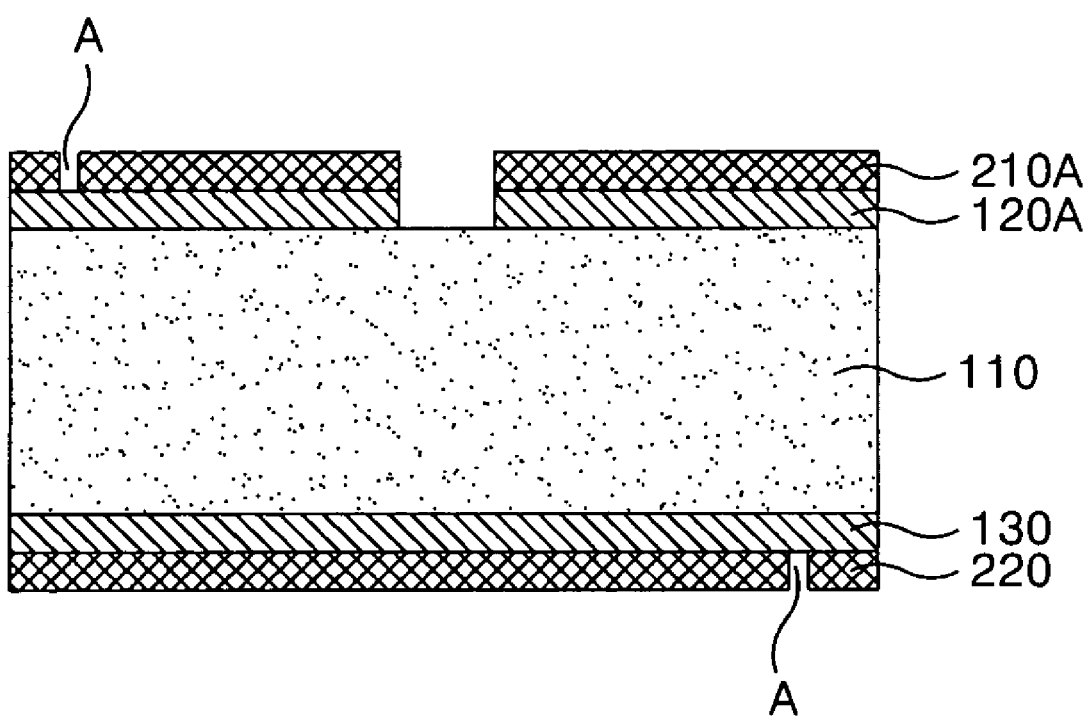

After forming the metal pattern 120A, a masking process is performed on the photo-resist 220 on the lower surface of the printing plate 110 and on the photo-resist pattern 210A formed on the upper surface of the printing plate 110, thereby forming contact hole areas A, as shown in FIG. 4E. The contact hole areas A are for applying power supplied from the outside across the printing plate 110 between the metal pattern 120A and the conductive layer 130.

Figure 4F:
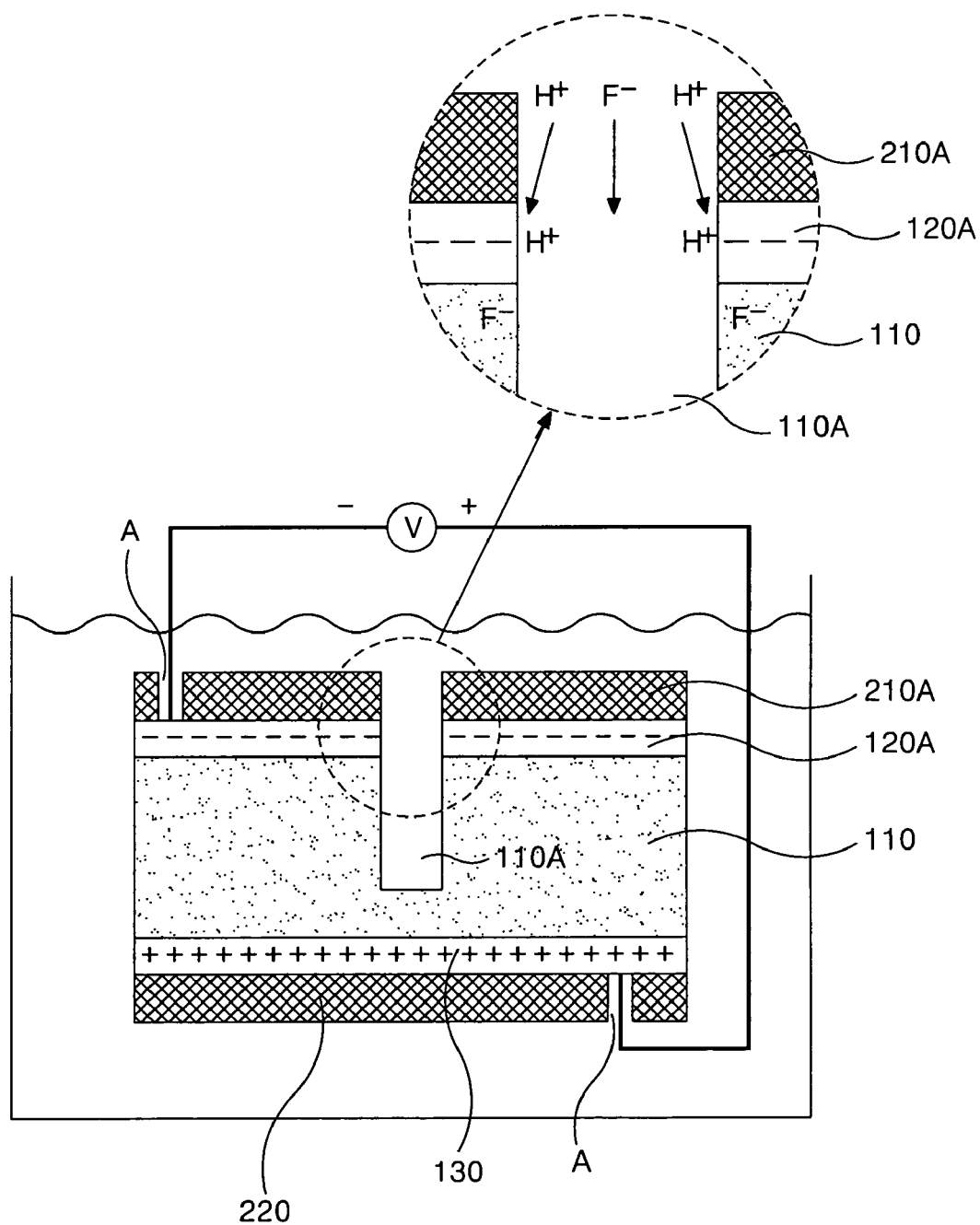

After forming the contact hole areas A for receiving the external power, the power is supplied to the conductive layer 130 and the metal pattern 120 opened through the contact hole area A which is formed in the photo-resist 220 and the photo-resist pattern 210A while the printing plate 110 is immersed in an electrolytic solution, as shown in FIG. 4F. At this moment, the outside power is supplied so that (−) potential is supplied to the metal pattern 120A on the upper surface of the printing plate 110 and (+) potential is supplied to the conductive layer 130 on the lower surface of the printing plate 110. The solution in which the printing plate 110 is immersed can be solutions that can form fluoric (F) ions that can dissolve a glass component, such as HF, $NH_4F$, or KF.

When applying power while the printing plate 110 is immersed in the solution, the H+ ions dissociated in the solution react with the metal pattern 120A formed on the upper surface of the printing plate 110 to generate hydrogen $H_2$, and the $F^-$ ions dissociated in the solution moves to the conductive metal layer 130 formed on the lower surface of the printing plate 110 and acts to etch the printing substrate 110 in a vertical direction commensurate with the electric field a chemical formula representing the above-described process is shown as follows.

[Chemical Formula]

Figure 4G:
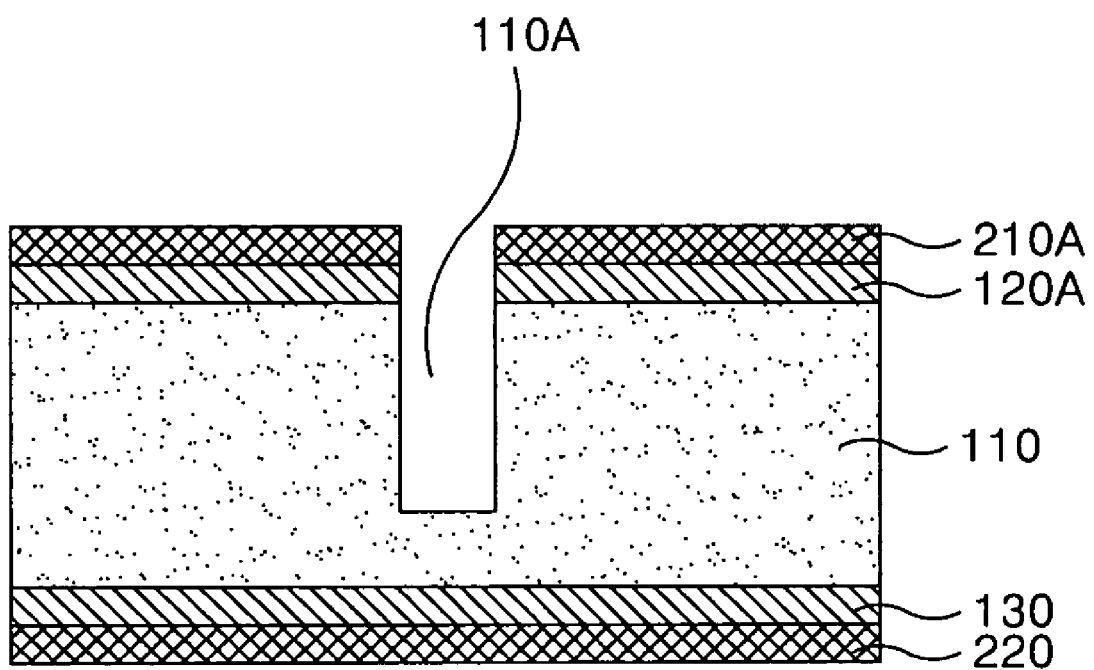

At this moment, the metal pattern 120A formed on the upper surface of the printing plate 110 pushes out or repels the $F^-$ ion dissociated in the solution due to the (−) potential, but on the contrary, the conductive layer 130 formed on the lower surface of the printing plate 110 pulls the $F^-$ ion dissociated in the solution due to the (+) potential. Accordingly, the $F^-$ ions dissociated in the solution perform most etching in the vertical direction of the printing plate 110 between the metal pattern 120a and the conductive layer 130 rather than in the horizontal direction of the printing plate 110. Thus, a fine pattern 110A etched anisotropically more in the vertical direction than in the horizontal direction is formed in the printing plate 110, as shown in FIG. 4G.

Figure 4H:
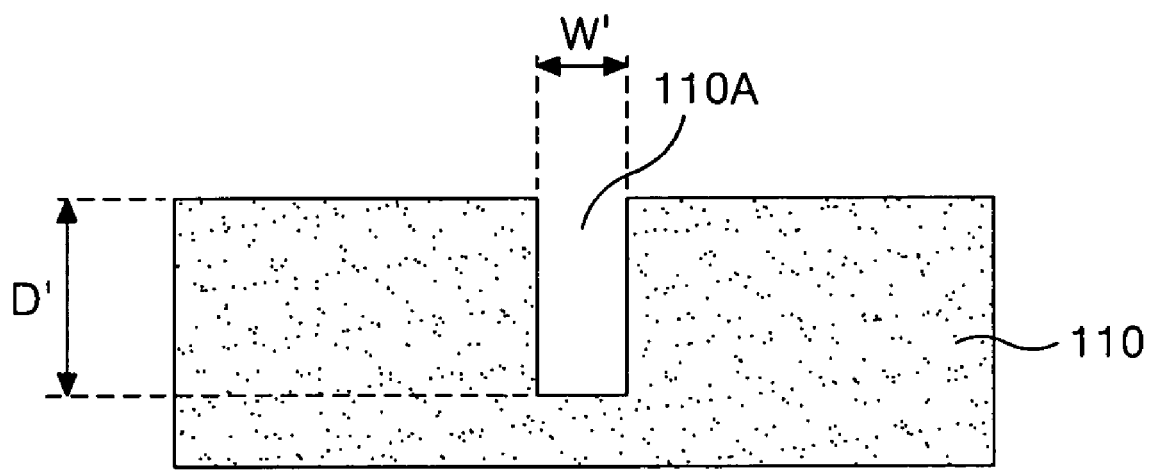

After the fine pattern 110A is anisotropically etched, the photo-resist 220 and the photo-resist pattern 210A, which are formed on the metal pattern 120A and the conductive layer 130 are removed by a stripping process. Then, the metal pattern 120A and the conductive layer 130 are then etched to complete the printing plate 110 in which the fine pattern 110A has been anisotropically etched further in the vertical direction W' than in the horizontal direction D', as shown in FIG. 4H.

As described above, the fabricating method of a printing plate according to embodiments of the present invention performs an etching process on the printing plate, which is immersed in an electrolytic solution, using electric fields such that the printing plate is anisotropically etched to form a fine pattern having a depth D' greater than its width W'.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A fabricating method of a printing plate, comprising:
   forming a first conductive layer on an upper surface of a printing plate;
   forming a second conductive layer on a lower surface of the printing plate;
   forming a first photo-resist layer on the first conductive layer;
   forming a second photo-resist layer on the second conductive layer;
   forming a first photo-resist pattern by etching a portion of the first photo-resist layer to form an opening in the first photo-resist layer exposing a first portion of the first conductive layer;
   etching the first portion of the first conductive layer using the first photo-resist pattern as a mask so as to form a metal pattern exposing a portion of the printing plate;
   forming a first contact hole in the first photo-resist pattern exposing a second portion of the metal pattern and forming a second contact hole in the second photo-resist layer exposing the second conductive layer to supply power to the metal pattern and the second conductive layer through the first and second contact holes;
   submerging the printing plate having the second conductive layer, the metal pattern, the first photo-resist pattern and the second photo-resist layer into an electrolytic solution;
   applying an electrical field between the metal pattern and the second conductive layer so that the electrolytic solution is dissociated to act to etch the printing plate in a vertical direction commensurate with the electric field so as to form an anisotropically etched pattern in the printing plate in which a width of the pattern is less than a depth of the pattern; and
   removing the metal pattern, the first photo-resist pattern, the second conductive layer and the second photo-resist layer.

2. The fabricating method according to claim 1, wherein the applying the electrical field between the metal pattern and the second conductive layer includes:
   applying a negative potential to the metal pattern; and
   applying a positive potential to the second conductive layer.

3. The fabricating method according to claim 1, wherein the first and second conductive layers includes one of Cr, Mo, Cu and ITO.

4. The fabricating method according to claim 1, wherein the electrolytic solution includes fluoric (F) ions capable of etching glass.

5. The fabricating method according to claim 1, wherein the electrolytic solution includes one of HF, $NH_4F$ and KF.

6. The fabricating method according to claim 1, wherein the printing plate is a glass.

* * * * *